United States Patent
Toyoda et al.

[11] Patent Number: 6,054,770
[45] Date of Patent: *Apr. 25, 2000

[54] ELECTRIC SOLID STATE DEVICE AND METHOD FOR MANUFACTURING THE DEVICE

[75] Inventors: Hiroshi Toyoda, Austin, Tex.; Jun-ichi Wada; Masahiko Hasunuma, both of Yokohama, Japan; Hisashi Kaneko, Fujisawa, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/909,733

[22] Filed: Aug. 12, 1997

[30] Foreign Application Priority Data

Aug. 13, 1996 [JP] Japan ..................................... 8-229444

[51] Int. Cl.⁷ ........................... H01L 29/41; H01L 29/45; H01L 21/44; H01L 21/28
[52] U.S. Cl. .......................... 257/762; 257/751; 257/761; 257/771; 438/688; 438/687; 438/653; 438/656
[58] Field of Search .................................. 257/751, 753, 257/761, 762, 771, 766, 767, 764, 763, 754; 438/648, 654, 653, 656, 687, 688

[56] References Cited

U.S. PATENT DOCUMENTS

| | | | |
|---|---|---|---|
| 3,743,894 | 7/1973 | Hall | 257/767 |
| 4,965,656 | 10/1990 | Koubuchi | 257/751 |
| 4,970,176 | 11/1990 | Tracy et al. | |
| 5,187,561 | 2/1993 | Hasunuma et al. | |
| 5,409,862 | 4/1995 | Wada et al. | |
| 5,449,641 | 9/1995 | Maeda | 438/653 |
| 5,580,823 | 12/1996 | Hegde | 438/648 |
| 5,629,236 | 5/1997 | Wada et al. | |
| 5,648,675 | 7/1997 | Terada | 257/52 |
| 5,705,429 | 1/1998 | Yamaha | 438/653 |

FOREIGN PATENT DOCUMENTS

| | | |
|---|---|---|
| 63-316456 | 12/1988 | Japan. |
| 5-90268 | 4/1993 | Japan. |
| 5-226337 | 9/1993 | Japan. |

OTHER PUBLICATIONS

IBM Tech. D. B. vol. 32 No. 10 B Mar. 1990 "Process in Resistance".

Tsutomu MITSUZUKA, "Highly Preferred [111]Texture in Al Films Deposited on Ultrathin Metal Underlayers", Jpn. J. Appl. Phys. vol. 31 (1992) pp. L1280–L 1283, Part 2, No. 9A, 1 Sept. 1992.

*Primary Examiner*—Jerome Jackson, Jr.
*Attorney, Agent, or Firm*—Oblon, Spivak, McClelland, Maier & Neustadt, P.C.

[57] ABSTRACT

An electric solid state device comprises a substrate, an amorphous thin film formed on the substrate, and a conductive thin film formed on the amorphous thin film. In this device, an interatomic distance calculated from a peak position of a halo pattern appearing in diffraction measurement of the material of the amorphous thin film is substantially equal to an interplanar space between those two adjacent specific crystal planes of the material of the conductive thin film, which are defined at least by respective atomic strings arranged in a predetermined direction in the respective planes and separated from each other by the smallest interatomic distance possible.

21 Claims, 3 Drawing Sheets

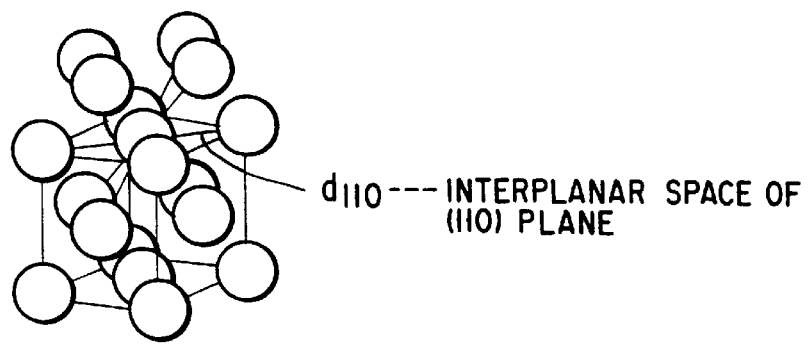
FIG. 1A  fcc STRUCTURE
$d_{110}$ --- INTERPLANAR SPACE OF (110) PLANE
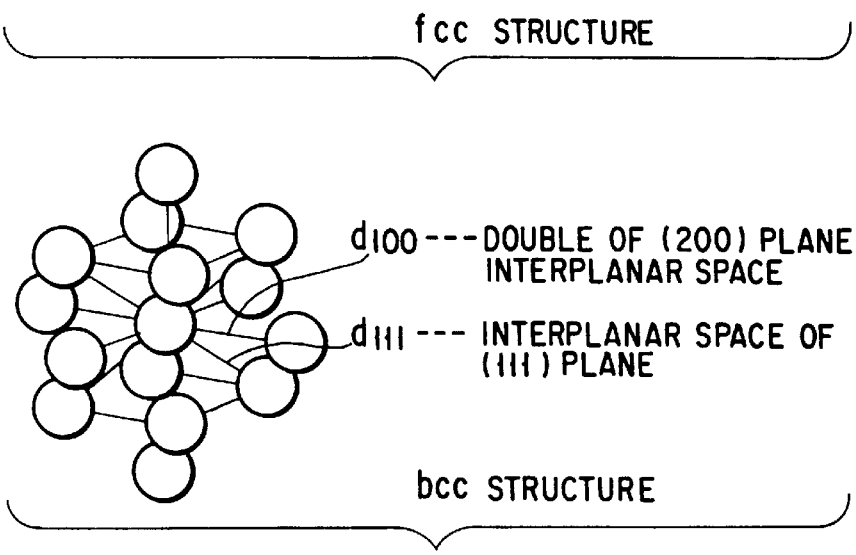
FIG. 1B  bcc STRUCTURE
$d_{100}$ --- DOUBLE OF (200) PLANE INTERPLANAR SPACE
$d_{111}$ --- INTERPLANAR SPACE OF (111) PLANE
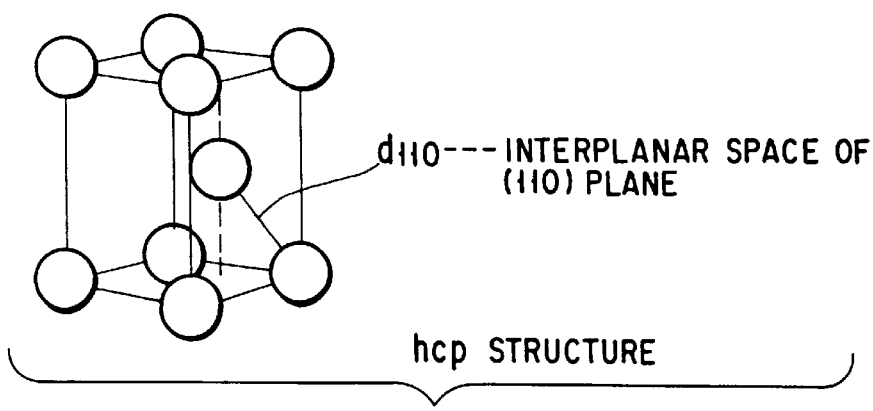
FIG. 1C  hcp STRUCTURE
$d_{110}$ --- INTERPLANAR SPACE OF (110) PLANE

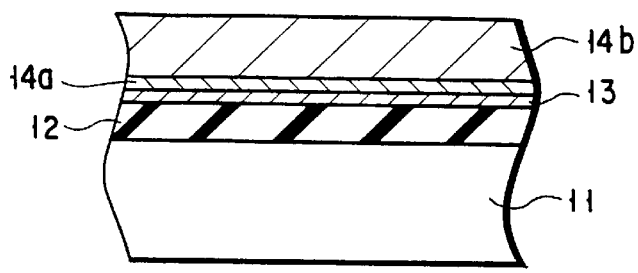
F I G. 2
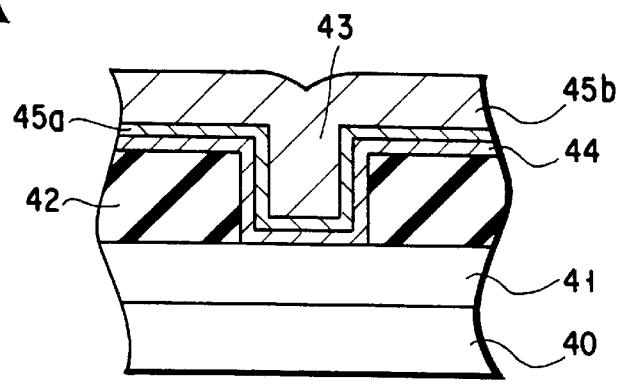
F I G. 5
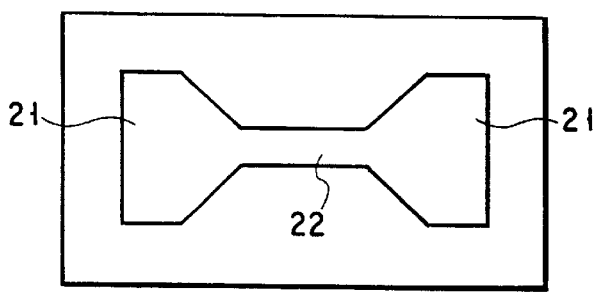
F I G. 3
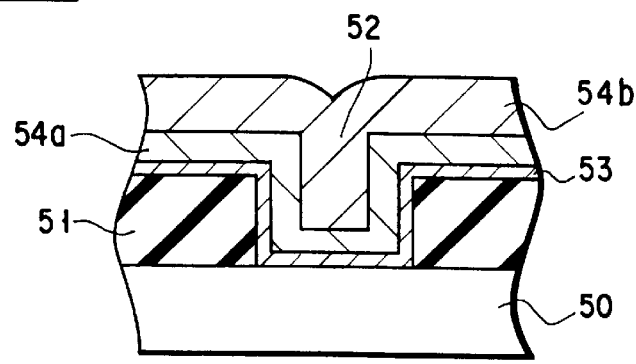
F I G. 6
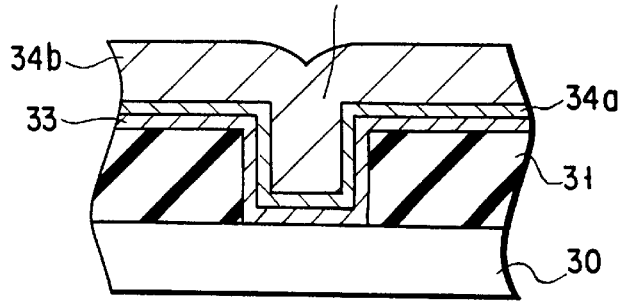
F I G. 4

ELECTRIC SOLID STATE DEVICE AND METHOD FOR MANUFACTURING THE DEVICE

BACKGROUND OF THE INVENTION

This invention relates to an electric solid state device and a method for manufacturing the same, and more particularly to a highly reliable electric solid state device with a high electromigration resistance, among other properties, and a method for manufacturing the same.

In accordance with recent remarkable development in the integration of semiconductor integrated circuit devices such as DRAMs, etc., refining of wiring, which is used for electrically connecting elements incorporated in the device, cannot be avoided. The refining technique requires that wiring should have a higher current density and higher operation temperature than ever, and also a higher electromigration resistance for imparting a higher reliability to the device.

The reason why refined wiring, which needs to have a high current density and high operation temperature, also needs to have a high electromigration resistance is that the electromigration resistance is inversely proportional to an increase in current density and operation temperature. At present, a semiconductor material such as a metal material (e.g. Al or an Al alloy) or polysilicon is used as the material of the refined wiring. The electromigration resistance of the metal material has been enhanced by, for example, the addition of a small amount of a transition metal (e.g. Cu, Ti) or the employment of a bamboo structure (i.e. a grain boundary structure like a bamboo node structure resulting from grain growth). However, it is considered difficult for these conventional techniques to impart a high reliability to wiring of the order of 0.1 $\mu$m width.

Recent research has proved that the aforementioned electromigration resistance and a stress migration resistance, due to a tensile stress occurring in wiring, can be remarkably enhanced by the employment of monocrystal wiring. In light of this, in order to obtain a high reliability, it is considered effective to make the crystal structure of a thin film for wiring to approach as close a monocrystal structure as possible.

However, in currently available semiconductor integrated circuit devices, a wire layer is formed on, for example, an amorphous thin film such as an inter-layer insulation film of silicon oxide. In this case, epitaxial crystal growth for growing a monocrystal thin film with the same crystal orientation as the under-layer cannot be performed, which means that it is very difficult to form a conductive thin film or wiring of high crystallinity.

On the other hand, the inventors of the present invention have found the following as a result of their research. A conductive thin film of an extremely high orientation is formed when an interatomic distance, calculated from the peak position of a halo pattern appearing in diffraction measurement of an amorphous thin film, is substantially equal to an interplanar space between those two adjacent specific crystal planes of the material of the conductive thin film, which are defined at least by respective atomic strings arranged in a predetermined direction in the respective planes and separated from each other by the smallest interatomic distance possible.

At the time of forming a wire layer by the above method, it is desirable to set the substrate temperature to a low value, in order to obtain a high orientation. This is because if the substrate temperature is high, a high orientation cannot be obtained. In general, however, it is preferable to set the substrate temperature to a high value, in order to grow a large grain film. Therefore, where the above method is employed, a high-orientation large-grain film is difficult to obtain.

BRIEF SUMMARY OF THE INVENTION

It is a first object of the invention to provide an electric solid state device having a conductive thin film of high crystallinity for wiring.

It is a second object of the invention to provide a method for manufacturing an electric solid state device having a high-orientation large-grain conductive thin film.

According to a first aspect of the invention, there is provided an electric solid state device comprising:

a substrate;

an amorphous thin film formed on the substrate; and a conductive thin film formed on the amorphous thin film;

wherein an interatomic distance calculated from a peak position of a halo pattern appearing in diffraction measurement of a material of the amorphous thin film is substantially equal to an interplanar space between those two adjacent specific crystal planes of a material of the conductive thin film, which are defined at least by respective atomic strings arranged in a predetermined direction in the respective planes and separated from each other by a smallest interatomic distance possible.

Preferably, in the electric solid state device, the formula $|df-ds|/ds \leq 0.25$ is satisfied, where ds represents the interatomic distance, and df represents the interplanar space.

More preferably, in the electric solid state device, the substrate has a depression, the amorphous thin film is formed on an inner surface of the depression, and the conductive thin film is buried in the depression with the amorphous thin film interposed therebetween.

It is desirable that in the electric solid state device, the amorphous thin film contains at least one of elements contained in the conductive thin film, and at least one selected from a group consisting of IV-group, V-group and VI-group elements.

In addition to the above, the amorphous thin film may further contain at least one selected from a group consisting of C, N, B, Si, P and Ge.

It is also desirable that the amorphous thin film contains at least one selected from a group consisting of IV-group, V-group and VI-group elements, and at least one selected from a group consisting of VIII-group, IX-group and X-group elements.

In addition to the above, the amorphous thin film may further contain at least one selected from a group consisting of C, N, B, Si, P and Ge.

It is preferable that the amorphous thin film contains at least one of elements contained in the conductive thin film, at least one XI-group element, and at least one selected from a group consisting of C, N, B, Si, P and Ge.

It is preferable that the conductive thin film contains at least one selected from a group consisting of Al, Cu, Au, Pt, Ag, W and Si.

Moreover, the amorphous thin film may contain TaAl, and the conductive thin film contains AlCu.

Alternatively, the amorphous thin film may contain NiZr, and the conductive thin film contain AlCu.

If the above-described structure is employed, a conductive thin film of high crystallinity for wiring can be formed on an underlayer having a trench or a hole formed therein, with an amorphous thin film interposed therebetween. This conductive thin film or wiring film has a high electromigration resistance and high stress migration resistance. Further, in the above structure, the trench or hole formed in the substrate is filled with the conductive thin film while the conductive thin film is being formed, thereby reducing the number of required process steps.

According to a second aspect of the invention, there is provided a method of manufacturing an electric solid state device comprising the steps of:

forming an amorphous thin film on a substrate; and forming a conductive thin film on the amorphous thin film;

wherein an interatomic distance calculated from a peak position of a halo pattern appearing in diffraction measurement of a material of the amorphous thin film is substantially equal to an interplanar space between those two adjacent specific crystal planes of a material of the conductive thin film, which are defined at least by respective atomic strings arranged in a predetermined direction in the respective planes and separated from each other by a smallest interatomic distance possible; and the step of forming the conductive thin film includes a first sub-step of performing film forming at a first temperature and a second sub-step, carried out after the first sub-step, of performing film forming at a second temperature higher than the first temperature.

Preferably, the first temperature is not more than 100° C., and the second temperature is not less than 150° C.

More preferably, transfer from the step of forming the amorphous thin film to the first-sub step of forming the conductive thin film is performed in a non-oxidizing atmosphere.

Also preferably, transfer from the first-sub step to the second-sub step is performed in a non-oxidizing atmosphere.

It is desirable that the method further comprises a step of forming a depression in the substrate before forming the amorphous thin film, and a step of flattening a surface of the conductive thin film to thereby make the conductive thin film remain only in the depression.

It is also desirable that the step of forming the amorphous thin film includes a step of forming an amorphous thin film containing at least one of elements contained in the conductive thin film, and at least one selected from a group consisting of IV-group, V-group and VI-group elements.

The step of forming the amorphous thin film may include a step of forming an amorphous thin film containing at least one selected from a group consisting of IV-group, V-group and VI-group elements, and at least one selected from a group consisting of VIII-group, IX-group and X-group elements.

The step of forming the amorphous thin film may include a step of forming an amorphous thin film containing at least one of elements contained in the conductive thin film, at least one XI-group element, and at least one selected from a group consisting of C, N, B, Si, P and Ge.

Moreover, the step of forming the conductive thin film may include a step of forming a conductive thin film containing at least one selected from a group consisting of Al, Cu, Au, Pt, Ag, W and Si.

Setting different substrate temperatures to form the conductive thin film enables the conductive thin film to have a high orientation and a large grain. This is because the film can have a high orientation at a low substrate temperature, and the crystal grain of the film can grow large at a high substrate temperature. Therefore, thus-obtained conductive thin film or wiring film has a high electromigration resistance and high stress migration resistance.

FIGS. 1A–1C show the largest interatomic distances in the fcc structure, the bcc structure and the hcp structure, respectively. In these figures, $d_{xyz}$ represents the interplanar space of (xyz) planes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A–1C are views, useful in explaining the largest interatomic distances in a fcc structure, a bcc structure and a hcp structure, respectively;

FIG. 2 is a sectional view, showing a wiring structure according to a first embodiment of the invention;

FIG. 3 is a plan view, showing the wiring structure according to the first embodiment of the invention;

FIG. 4 is a sectional view, showing a wiring structure according to a second embodiment of the invention;

FIG. 5 is a sectional view, showing a wiring structure according to a third embodiment of the invention;

FIG. 6 is a sectional view, showing a wiring structure according to a fourth embodiment of the invention;

DETAILED DESCRIPTION OF THE INVENTION

Figure 7:
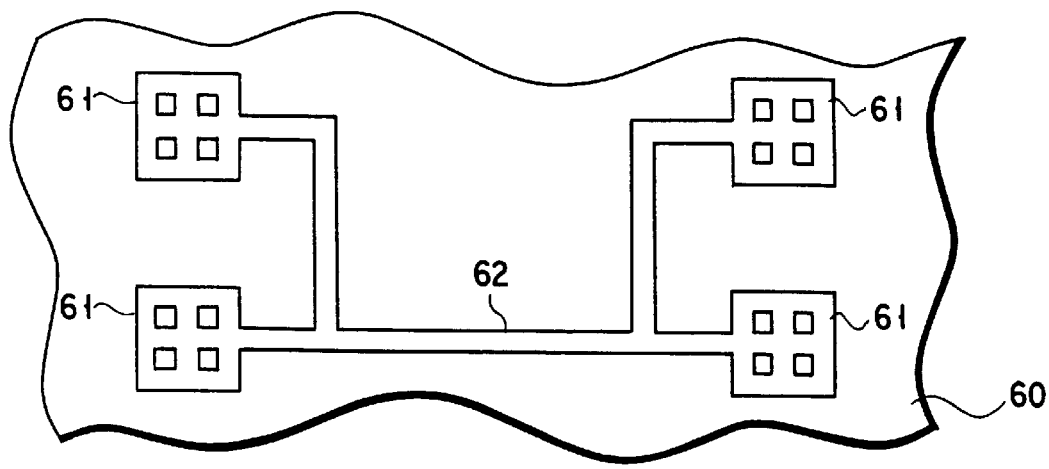
FIG. 7 is a sectional view, showing a wiring structure according to a fifth embodiment of the invention.

Before referring to specific embodiments of the invention, the principle and concept thereof will be explained.

To bury a wiring material in a fine via hole of a high aspect ratio, it is important to use an underlayer of high wettability. According to a classic energy correlation theory, the wet angle θ between the material of a substrate and a material deposited thereon is given by $$\cos \theta = \gamma s - \gamma i / \gamma f$$

where γs represents the surface energy of the substrate material, γf the surface energy of the deposited material, and γθ the interfacial energy between the substrate material and the deposited material.

It is understood from the above equation that the higher the surface energy of the substrate material (which is used as the underlayer material) and the lower the interfacial energy, the smaller the wet angle θ and the higher the wettability of the substrate or underlayer (supposing that the same deposited material is used as a wiring material). If the formula $\gamma s-\gamma i \geq \gamma f$ is satisfied in an extreme case, the wet angle $\theta$ is 0 and hence ideal burying characteristics may be obtained. The surface energy values $\gamma s$ and $\gamma f$ are peculiar to the respective materials, while the interfacial energy $\gamma i$ is considered to depend upon lattice matching between the materials forming the interface or upon the coupling energy thereof.

To form a thin film of a high crystallinity, it is important to restrain the occurrence of a crystal nucleus to the utmost in the initial stage of film forming, for the same reason as stated above concerning the wettability. Specifically, if $\gamma s-\gamma i \geq \gamma f$, the wet angle $\theta$ is 0 and so-called layer growth will occur. As a result, a thin film of an extremely high crystallinity will be formed.

As is stated above, the inventors of the present invention have found, as a result of their research so far, that a conductive thin film of an extremely high orientation is formed on an amorphous thin film when an interatomic distance ds calculated from the peak position of a halo pattern appearing in diffraction measurement of the amorphous thin film is substantially equal to an interplanar space df between those two adjacent specific crystal planes of the material of the conductive thin film, which are defined at least by respective atomic strings arranged in a predetermined direction in the respective planes and separated from each other by the largest interatomic distances possible. In this case, it is most desirable that the interatomic distance ds is perfectly equal to the interplanar space. However, if $|df-ds|/ds \leq 0.25$ is satisfied, they can be considered substantially equal to each other.

The specific crystal planes of the material of the conductive thin film, which are defined at least by respective atomic strings arranged in a predetermined direction in the respective planes and separated from each other by the largest interatomic distances possible, are, for example, (111), (200) and (220) planes in the case of the fcc structure, (200) and (110) planes in the case of the bcc structure, and (002) and (110) planes in the case of the hex structure. Thus, the specific crystal planes are not limited to specific orientation planes.

As the material of the amorphous thin film, a metal or an alloy thereof which can be converted to have an amorphous structure, or a conductive compound can be used. Further, in light of the capability of forming an amorphous structure, the composition of the amorphous thin film is preferably an alloy of a transition metal, a metalloide and a semiconductor. Specifically, it suffices if the amorphous thin film has a composition as recited below. Parenthesized elements below are meant that at least one of them is contained, and reference sign M denotes at least one element included in the elements constituting the material of wiring.

M-IV group (Ti, Zr, Hf)
M-IV group—C, N, B, Si, P, Ge
M-V group (V, Nb, Ta)
M-V group—C, N, B, Si, P, Ge
M-VI group (Cr, Mo, W)
M-VI group-C, N, B, Si, P, Ge
M-IV group-V group
M-IV group-V group—C, N, B, Si, P, Ge
M-group-VI group
M-IV group-VI group—C, N, B, Si, P, Ge
M-V group-VI group
M-V group-VI group—C, N, B, Si, P, Ge
M-IV group-V group-VI group
M-IV group-V group-VI group—C, N, B, Si, P, Ge At least one element selected from the group consisting of IV group, V group and VI group—at least one element selected from the group consisting of VIII group (Fe, Ru, Os), IX group (Co, Rh, Ir) and X group (Ni, Pd, Pt)

At least one element selected from the group consisting of IV group, V group and VI group—at least one element selected from the group consisting of VIII group, IX group and X group—C, N, B, Si, P, Ge X group—II group (Cu, Ag, Au)—C, N, B, Si, P, Ge The composition ratios of those elements are determined so that an amorphous structure can be formed. Further, an amorphous film with a thickness of about 1 nm or more can realize the amorphous structure. The thickness of the thin film can be set relatively freely within the range in which it does not disable the function of a conductive thin film formed thereon.

Al, Au, Pt, Ag or each alloy thereof having a low resistance and the fcc structure, W having the bcc structure, or polysilicon can be used as the material of the conductive thin film for wiring.

As a method for forming the amorphous thin film, it is preferable to employ sputtering, deposition, CVD, etc. In the case of sputtering, the collimation sputtering method using a collimator, or the long-throw sputtering method in which a target is separated from a substrate by a long distance is preferable in order to enhance the coverage of a groove or a hole. Moreover, as a method for forming the conductive film (wiring), deposition or CVD may be used, as well as sputtering which is generally used.

When the conductive thin film is formed by sputtering, etc., if the temperature of the substrate is too high, the anisotropy in surface energy due to crystal orientation is reduced, thereby degrading the orientation. To avoid this, at the time of forming a conductive film of e.g. Al or an Al alloy on an amorphous thin film, the substrate temperature is set first to a low value (preferably 100° C. or less) so as to enhance the orientation. After a conductive thin film with high orientation is formed to a certain thickness, it can be grown with the high orientation maintained, even if the substrate temperature is increased to a high value (preferably, more than 150° C., and less than the melting point of the material of the conductive thin film). In general, the grain of the crystal can be enlarged at a high substrate temperature. That is, the two-stage film forming enables forming of a conductive thin film with a large grain and high orientation.

Such two-stage film forming is performed, for example, by forming a film to a certain thickness at a low substrate temperature and successively growing the film at a high substrate temperature, or by successively performing film forming in a plurality of chambers in which different substrate temperatures are employed. Moreover, the substrate may be heated with a heater or an infrared lamp, or by induction heating.

To form a conductive thin film with high orientation, it is also important to prevent an oxide film from being formed on the amorphous thin film. To this end, it is preferable to sequentially form a conductive thin film in a device in which the pressure therein is kept at a sufficient vacuum value. If, however, an oxide film is formed on the amorphous thin film as a result of exposure to the atmosphere, it suffices if a conductive thin film is formed after removing the oxide film by surface bias cleaning, etc. In addition, even where the conductive thin film is formed using different substrate temperatures in two or more stages, oxide films are prevented or removed in the same manners as above.

The specific embodiments of the invention will now be described in detail.

(First Embodiment)

Referring first to FIGS. 2 and 3, a first embodiment will be described.

In this embodiment, a lamination structure as shown in FIG. 2 is formed and then patterned as shown in FIG. 3. The resultant structure is estimated as shown in table 1. These steps will be described in detail.

tially formed, by varying the substrate temperature and the film thickness, in the second and third chambers without carrying the wafer out of the vacuum sputtering device. The sputtering conditions in this case are as follows:

Sputtering method: DC magnetron method
Target: Al–0.5 wt % Cu target with 250 mm φ
Sputtering gas: Ar

TABLE 1

|  | 2nd Chamber | | 3rd Chamber | | Full Width at Half Maximum | Average Grain Diameter | Electro-migration Resistance |
| --- | --- | --- | --- | --- | --- | --- | --- |
|  | Substrate Temperature | Film Thickness | Substrate Temperature | Film Thickness | | | |
| Sample 1 | Room Temperature | 10 nm | 300° C. | 590 nm | 0.66° | 1.3 μm | Excellent |
| Sample 2 | Room Temperature | 100 nm | 300° C. | 500 nm | 0.55° | 1.2 μm | Excellent |
| Sample 3 | Room Temperature | 300 nm | 300° C. | 300 nm | 0.59° | 1.2 μm | Excellent |
| Sample 4 | Room Temperature | 10 nm | 150° C. | 590 nm | 0.67° | 1.1 μm | Excellent |
| Sample 5 | Room Temperature | 10 nm | 400° C. | 590 nm | 0.68 | 1.4 μm | Excellent |
| Sample 6 | 100° C. | 10 nm | 150° C. | 590 nm | 0.54° | 1.1 μm | Excellent |
| Sample 7 | 100° C. | 10 nm | 400° C. | 590 nm | 0.65° | 1.3 μm | Excellent |
| Sample 8 | Room Temperature | 600 nm | — | 0 nm | 0.92° | 0.2 μm | Good |
| Sample 9 | — | 0 nm | 300° C. | 600 nm | 3.43° | 1.5 μm | Poor |
| Sample 10 | 150° C. | 10 nm | 300° C. | 590 nm | 2.36° | 1.4 μm | Poor |
| Sample 11 | Room Temperature | 10 nm | 100° C. | 590 nm | 0.74° | 1.3 μm | Good |

In FIG. 2, reference numeral 11 denotes a silicon substrate (6-inch wafer), reference numeral 12a thermal oxide film (with a thickness of 100 nm), reference numeral 13a TaAl film (an amorphous thin film), reference numeral 14a an AlCu film (a lower conductive thin film) formed at a low temperature, and reference 14b an AlCu film (an upper conductive thin film) formed at a high temperature. Although in FIG. 2, a border line is drawn between the AlCu films 14a and 14b for convenience' sake, it is a matter of course that there is no clear boundary therebetween, actually. Specific steps for obtaining the FIG. 2 structure will be described.

First, a TaAl film 13 as an amorphous thin film is formed in one of three chambers incorporated in a sputtering device, under the following sputtering conditions:

Sputtering method: DC magnetron method
Target: Ta/Al mosaic target with 250 mm φ
Sputtering gas: Ar
Gas pressure: 1 Pa
Power applied: 2 W/cm$^2$
Substrate temperature: 25° C. (constant)
Film thickness: 10 nm (constant).

The composition of a film actually obtained in the above-described manner was analyzed and found to be $Ta_{60}$ at % $Al_{40}$ at %. Further, X-ray diffraction measurement was performed, and the film was determined to be an amorphous film, and the interatomic distance ds corresponding to the peak position of its halo pattern was determined to be 0.234 nm. The interplanar space df of Al (111) was also 0.234 nm, and accordingly |df−ds|/df=0. Thus, the interatomic distance is perfectly equal to the interplanar space. The thickness of the film is not limited to 10 nm, but may be modified depending upon the contents of a process, etc.

Then, the AlCu films 14a and 14b which will serve as conductive thin films (i.e. serve as wire layers) are sequen- Gas pressure: 1 Pa
Power applied: 10 W/cm$^2$
Substrate temperature: Varied (see table 1)
Film thickness: Varied (see table 1)

The thus-obtained AlCu films 14a and 14b are subjected to X-ray diffraction measurement, where the full width at half maximum of the rocking curve is measured to estimate the orientation of the films. At the same time, the average grain diameter is measured. Table 1 shows actual measurement results.

Thereafter, the thus-obtained AlCu films 14a and 14b are subjected to patterning by lithography and RIE, thereby forming electrode portions 21 and a wiring portion 22 (width: 0.5 μm) as shown in FIG. 3.

A current of $2 \times 10^6$ A/cm$^2$ is applied to the wiring portion 22 of the resultant sample chip at a test temperature of 200° C., thereby measuring the time required until the resistance of the chip increases by 10% to thereby estimate the electromigration resistance of the chip. The estimation result is also shown in table 1. The above-described measurement and estimation were performed with respect to samples 1–11. As is evident from table 1, an excellent AlCu film was formed in each of samples 1–7.

(Second Embodiment)

Referring then to FIG. 4, a second embodiment of the invention will be described.

In this embodiment, a trench 32 (width: 0.3 μm; depth: 3 μm) is formed in an SiO$_2$ film (interlayer insulating film) 31 provided on a major surface of a silicon substrate (6-inch wafer) 30. Then, an NiZr film (amorphous thin film) 33, an AlCu film (lower conductive thin film) 34a to be formed at a low temperature, and an AlCu film (upper conductive thin film) 34b to be formed at a high temperature are provided on the resultant structure in this order. Although in FIG. 4, a border line is drawn between the AlCu films 34a and 34b for convenience' sake, there is no definite border actually. A process for obtaining the FIG. 4 structure will now be described in detail.

In this embodiment, a sputtering device of a three-chamber structure similar to that used in the first embodiment is used, and the distance between the target and the substrate is set to 200 mm in each chamber, thereby forming the NiZr film 33 and the AlCu films 34a, 34b.

First, the NiZr film 33 as the amorphous thin film is formed in a first chamber under the following sputtering conditions:

Sputtering method: DC magnetron method
Target: Ni/Zr mosaic target with 250 mm φ
Sputtering gas: Ar
Gas pressure: 1 Pa
Power applied: 2 W/cm$^2$
Substrate temperature: Room temperature of 25° C.
Film thickness: 30 nm.

The composition of a film obtained in the above-described manner was analyzed and found to be $Ni_{30}$ at % $Zr_{70}$ at %. Further, X-ray diffraction measurement was performed, and the film was found to be an amorphous film, and the interatomic distance ds corresponding to the peak position of its halo pattern was determined to be 0.251 nm. The interplanar space df of Al (111) was 0.234 nm, and accordingly |df–ds|/df=0.073. Thus, the interatomic distance is substantially equal to the interplanar space. Further, widening the distance between the target and the substrate to 200 mm enabled a NiZr film 33 with a thickness of 10 nm to be formed substantially uniformly on the wall surfaces which define the trench 32.

Thereafter, the resultant wafer is transferred to a second chamber without being carried out of the vacuum atmosphere, where the AlCu film 34a as the lower conductive thin film is formed thereon under the following sputtering conditions:

Sputtering method: DC magnetron method
Target: Al–0.5 wt % Cu target with 250 mm φ
Sputtering gas: Ar
Gas pressure: 1 Pa
Power applied: 10 W/cm$^2$
Substrate temperature: Room temperature of 25° C.
Film thickness: 200 nm.

Subsequently, the resultant wafer is transferred to a third chamber without being carried out of the vacuum atmosphere, where the AlCu film 34b as the upper conductive thin film is formed thereon under substantially the same sputtering conditions as those employed in the second chamber, except that the substrate temperature is set to 450° C. and the thickness to 400 nm. These conditions enable forming of AlCu films 34a and 34b which can be buried in the trench 32 in a reliable manner and have flat surfaces. Thereafter, a chemical mechanical polishing (CMP) treatment is performed to thereby leave the AlCu films only in the trench 32.

The thus-obtained samples were subjected to X-ray diffraction measurement, where the full width at half maximum of the rocking curve of the Al (111) peak was measured to estimate the orientation of each of the AlCu films. As a result, it was determined that the films each have extremely high orientation with a value of 0.69 degree as the full width at half maximum, and that they each have an average grain diameter of 1.2 μm and have a complete bamboo structure. The thus-obtained sample was subjected to migration resistance estimation, where a current of $2 \times 10^6$ A/cm$^2$ is applied to the samples by means of a prober at a test temperature of 200° C., thereby measuring the time required until the resistance of the sample increases by 10%. The estimation result showed that the sample has a good electromigration resistance.

On the other hand, in a case where the AlCu films 34a and 34b were directly formed on the SiO$_2$ film 31 and no NiZr film 33 was interposed therebetween, these AlCu films showed no excellent properties. More specifically, without the NiZr film 33, the films 34a and 34b did not have an excellent orientation. Moreover, the AlCu film 34a with a thickness of 200 nm formed in the second chamber coagulated in the third chamber in which the substrate temperature was set high, and hence the inner surface of the trench 32 could not been sufficiently filled with the AlCu film 34a and the AlCu film 34b. Furthermore, in the case of only performing low-temperature film forming in the second chamber, the trench portion 32 had a cavity therein and could not completely been filled with the AlCu film even by a heat treatment added later. In addition, in the case of only performing high-temperature film forming in the third chamber, the film did not have an excellent orientation and hence showed as low electromigration resistance as sample 9 or 10 in table 1, although it was buried in the trench 32.

(Third Embodiment)

Referring then to FIG. 5, a third embodiment of the invention will be described.

In the third embodiment, an SiO$_2$ film (interlayer insulating film) 42 is formed on a lower wiring layer 41 on a major surface of a silicon substrate (6-inch wafer) 40, and a via hole 43 is formed in the SiO$_2$ film 42. Subsequently, a TaAl film (amorphous thin film) 44, an AlCu film (lower conductive thin film) 45a to be formed at a low temperature, and an AlCu film (upper conductive thin film) 45b to be formed at a high temperature are provided on the resultant structure in this order. Although in FIG. 5, a border line is drawn between the AlCu films 45a and 45b for convenience' sake, there is no definite border actually. A process for obtaining the FIG. 5 structure will now be described in detail.

First, the SiO$_2$ film 42 is formed on the lower wiring layer 41, and the via hole 43 (0.15 μm×0.15 μm) is formed in the SiO$_2$ film 42 by usual PEP and etching. Subsequently, a TaAl film 44 (with a thickness of 30 nm) is deposited on the SiO$_2$ film 42 with the via hole 43 by CVD using triisobutylalminium and tantalum chloride as source gases.

The composition of a film actually obtained in the above-described manner was analyzed and found to be $Ta_{50}$ at % $Al_{50}$ at %. Further, X-ray diffraction measurement was performed, and the film was determined to be an amorphous film, and the interatomic distance ds corresponding to the peak position of its halo pattern was determined to be 0.234 nm. The interplanar space df of Al (111) was also 0.234 nm, and accordingly |df–ds|/df=0. Thus, the interatomic distance is perfectly equal to the interplanar space.

Thereafter, the wafer with the TaAl film 44 is transferred from the CVD chamber to a sputtering chamber through a transfer chamber, the atmosphere of which is kept at a high vacuum value of $3.0 \times 10^{-7}$ Pa, thereby forming the AlCu film 45a which serves as the lower conductive thin film. The sputtering conditions employed in this case are substantially the same as those employed in the second embodiment, except that the distance between the target and the substrate is set to 200 mm, and the film thickness to 50 nm. These conditions enable the AlCu film 45a to be uniformly formed on the TaAl film 44.

Subsequently, the AlCu film 45b is formed to 400 nm on the AlCu film 45a at a substrate temperature of 450° C.

under substantially the same conditions as the above sputtering conditions. As a result, the AlCu films 45a and 45b which can be sufficiently buried in the via hole 43 are obtained.

The resultant wafer is subjected to chemical mechanical polishing (CMP) to thereby form the upper wiring layers (the AlCu films 45a and 45b) connected to the lower wiring layer 41 through the via hole 43.

The orientation of an AlCu film actually obtained in the above manner was estimated by X-ray diffraction measurement, and it was confirmed that the film was an extremely high orientation film showing a rocking curve with 0.58 degree as the full width at half maximum. Moreover, a wire with a width of 0.4 µm worked by the conventional lithography and RIE showed an excellent electromigration resistance, and the AlCu film had an average grain diameter of 1.4 µm and had a perfect bamboo structure.

(Fourth Embodiment)

Referring to FIG. 6, a fourth embodiment of the invention will be described.

In this embodiment, a hole 52 (diameter: 0.35 µm; depth: 1.1 µm) is formed in an $SiO_2$ film 51 (thickness: 1.2 µm) provided on a silicon substrate (6-inch wafer) 50. Then, an TaAl film (amorphous thin film) 53, an AlCu film (lower conductive thin film) 54a to be formed at a low temperature, and an AlCu film (upper conductive thin film) 54b to be formed at a high temperature are sequentially provided on the resultant wafer by means of a sputtering device of a three-chamber structure, with the wafer kept under a vacuum pressure. Although in FIG. 6, a border line is drawn between the AlCu films 54a and 54b for facilitating the explanation, there is no definite border actually. A process for obtaining the FIG. 6 structure will be described in detail.

First, the TaAl film 53 as the amorphous thin film is formed in a first chamber under the following sputtering conditions:

Sputtering method: DC magnetron method
Target: Ta/Al mosaic target with 250 mm φ
Sputtering gas: Ar
Gas pressure: 0.03 Pa
Power applied: 10 W/cm$^2$
Substrate temperature: Room temperature of 25° C.
Film thickness: 50 nm
Film forming speed: 1.7 nm/sec.
Distance between target and substrate: 300 mm.

The composition of a film actually obtained in the above-described manner was analyzed and found to be $Ta_{70}$ at % $Al_{30}$ at %. Further, X-ray diffraction measurement was performed, and the film was determined to be an amorphous film, and the interatomic distance ds corresponding to the peak position of its halo pattern was determined to be 0.234 nm. The interplanar space df of Al (111) was 0.234 nm, and accordingly |df−ds|/df=0. Thus, the interatomic distance is equal to the interplanar space. Further, the employment of the long throw sputtering method in which the distance between the target and the substrate is set as long as 300 mm enabled forming of the TaAl film 53 also on the wall and bottom of the hole 52.

Thereafter, the resultant wafer is transferred to a second chamber without being carried out of the vacuum device, where the AlCu film 54a as the lower conductive thin film is formed on the wafer under the following sputtering conditions:

Sputtering method: DC magnetron method
Target: Al–0.5 wt% Cu target with 250 mm φ
Sputtering gas: Ar
Gas pressure: 0.03 Pa
Power applied: 25 W/cm$^2$
Substrate temperature: Room temperature of 25° C.
Film thickness: 200 nm
Film forming speed: 3.3 nm/sec.
Distance between target and substrate: 300 mm.

Subsequently, the resultant wafer is transferred to a third chamber without being carried out of the vacuum device, where the AlCu film 54b as the upper conductive thin film is formed on the wafer under the following sputtering conditions:

Sputtering method: DC magnetron method
Target: Al–0.5 wt % Cu target with 250 mm φ
Sputtering gas: Ar
Gas pressure: 0.16 Pa
Power applied: 2 W/cm$^2$
Substrate temperature: 450° C.
Film thickness: 400 nm
Film forming speed: 0.8 nm/sec.
Distance between target and substrate: 50 mm.

A sectional SEM photograph observation of a sample obtained in the above-described manner revealed that the hole of a high aspect ratio is completely filled with the AlCu films 54a and 54b. Further, the orientation of the AlCu film was estimated by X-ray diffraction measurement, and it was confirmed that the film was an extremely high orientation film showing a rocking curve with 0.52 degree as the full width at half maximum. It should be noted that where the AlCu films 54a and 54b were formed directly on the $SiO_2$ film 51 without the TaAl film 53, the hole 52 could not completely be filled.

(Fifth Embodiment)

Referring to FIG. 7, a fifth embodiment of the invention will be described.

In this embodiment, trenches (width: 0.4 µm; depth: 4 µm) which will serve as an electrode pattern 61 and a wiring pattern 62 are formed in an $SiO_2$ film (thickness: 0.8 µm) provided on a silicon substrate (6-inch wafer) 60. Then, a TaAl film (amorphous thin film), an AlCu film (lower conductive thin film) to be formed at a low temperature, and an AlCu film (upper conductive thin film) to be formed at a high temperature are provided on the $SiO_2$ film such that they are buried in the trenches. The film forming conditions and methods are similar to those employed in the fourth embodiment and hence will not be described.

An AlCu film actually obtained in the aforementioned manner was found to be completely buried in all trenches, and found to be an extremely high orientation film showing a rocking curve having a value of 0.50 degree as the full width at half maximum. Moreover, after the resultant wafer was polished such that the AlCu film remained only in the trenches, the wiring resistance was measured by the four probe method and found to be an excellent value of 3.0 µΩ·cm. The reason why the excellent wiring resistance was obtained seems that the AlCu film formed at 450° C. does not show a high resistance in light of the fact that TaAl reacts with AlCu at 500° C. and forms $Al_3Ta$.

In addition, a current of $2\times10^6$ A/cm$^2$ was applied to the resultant wafer at a test temperature of 200° C. to measure its wiring resistance. An increase in wiring resistance was found to be 2% even after 1000 hours elapsed. This means that the extremely high orientation remarkably enhances the electromigration resistance of the wafer. It should be noted that where the AlCu films were formed directly on the $SiO_2$ film without the TaAl film, they were not completely buried in the trenches.

(Sixth Embodiment)

Figure 8:
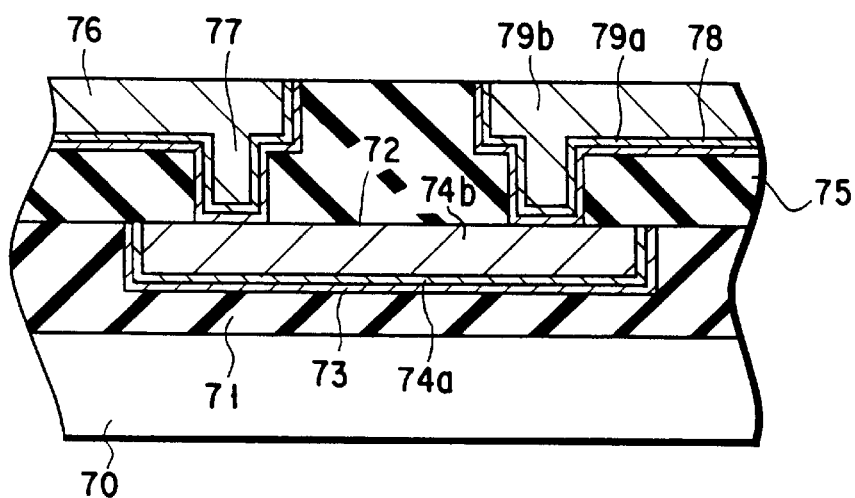
FIG. 8 is a sectional view, showing a wiring structure according to a sixth embodiment of the invention.

Referring to FIG. 8, a sixth embodiment of the invention will be described.

In this embodiment, a trench 72 (width: 0.4 μm; depth: 4 μm) is formed in an $SiO_2$ film 71 (thickness: 0.8 μm) provided on a silicon substrate (6-inch wafer) 70. Then, a TaAl film (amorphous thin film) 73, an AlCu film (lower conductive thin film) 74a to be formed at a low temperature, and an AlCu film (upper conductive thin film) 74b to be formed at a high temperature are provided on the $SiO_2$ film such that they are buried in the trench 72. The film forming conditions and methods are similar to those employed in the fourth embodiment. Thereafter, only those portions of the AlCu films which are buried in the trench 72 are made to remain by polishing, thereby forming a lower wire layer.

Subsequently, an $SiO_2$ film 75 which will serve as an interlayer insulating film is formed, and a trench which will serve as an upper wiring layer, and a via hole 77 for connecting the upper and lower wiring layers are formed in the $SiO_2$ film 75. Then, a TaAl film (amorphous thin film) 78, an AlCu film 79a to be formed at a low temperature, and an AlCu film 79b to be formed at a high temperature are provided on the $SiO_2$ film 75 with the trench 76 and the via hole 77 formed therein. The film forming conditions and methods of the TaAl film 78 and the AlCu films 79a and 79b are similar to those employed in the fourth embodiment. The AlCu film 79b was actually grown to a thickness of 800 nm, with the result that the trench 76 and the via hole 77 were filled without any void.

An AlCu film actually obtained in the aforementioned manner was found to be completely buried in all trenches, and found to be an extremely high orientation film showing a rocking curve having a value of 0.50 degree as the full width at half maximum. Moreover, after the resultant wafer was polished such that the AlCu film remained only in the trenches, the wiring resistance was measured by the four probe method and found to be an excellent value of 3.0 $\mu\Omega\cdot cm$. The reason why the excellent wiring resistance could be obtained seems that the AlCu film was formed at 450° C. which is lower than 500° C. at which TaAl will react with AlCu to thereby create $Al_3Ta$, and hence showed no increase in resistance.

Furthermore, since the trench 76 and the via hole 77 are filled with the AlCu films, the resultant wafer shows a low wiring resistance. Where a current of $2 \times 10^6 A/cm^2$ was applied to the resultant wafer at a test temperature of 200° C., an increase in resistance was only 2% even after 1000 hours elapse, and any voids which may well be formed in a via hole could not be found in the via hole 77. This means that filling the trench 76 and via hole with AlCu films with an extremely high orientation significantly enhances the reliability of the wafer.

(Seventh Embodiment)

Figure 9:
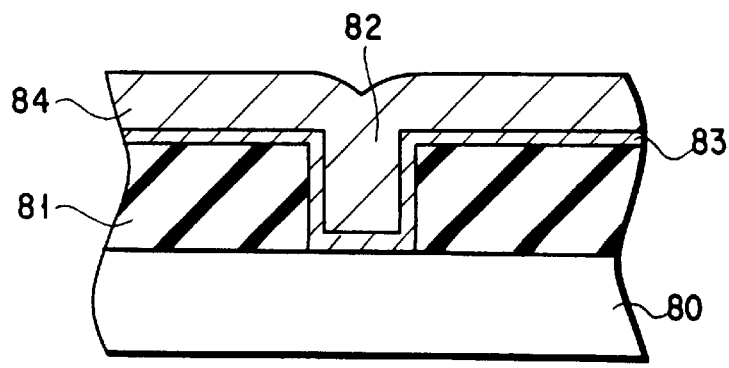
FIG. 9 is a sectional view, showing a wiring structure according to a seventh embodiment of the invention.

Referring to FIG. 9, a seventh embodiment of the invention will be described.

In this embodiment, a hole 82 (diameter: 0.15 μm; depth: 0.9 μm) is formed in an $SiO_2$ film 81 (thickness: 1.0 μm) provided on a silicon substrate (6-inch wafer) 80, and then a TaAl film (amorphous thin film) 83 and an Al film (conductive thin film) 84 are deposited on the resultant structure by means of a CVD device of a two-chamber structure, with the wafer kept under a vacuum pressure. A process for obtaining the FIG. 9 structure will be described in detail.

First, the TaAl film 83 as the amorphous thin film is formed in a first chamber under the following conditions:

CVD method: Thermal CVD method
Source gas: $Al(i-C_4H_9)_3$ $TaCl5$
Carrier gas: Ar
Gas pressure: 0.02 Pa
Substrate temperature: 450° C.
Film thickness: 30 nm
Film forming speed: 20 nm/sec.

Under the above conditions, the TaAl film 83 is substantially uniformly formed on the overall inner surface of the hole 82.

The composition of a film actually obtained in the above-described manner was analyzed and found to be 65 wt % Ta and 35 wt % Al. Further, X-ray diffraction measurement was performed, and the film was determined to be an amorphous film, and the interatomic distance ds corresponding to the peak position of its halo pattern was determined to be 0.234 nm. The interplanar space df of Al (111) was also 0.234 nm, and accordingly $|df-ds|/df=0$. Thus, the interatomic distance is equal to the interplanar space.

Thereafter, the resultant wafer with the TaAl film is transferred to a second chamber through a transfer chamber with an interior pressure of $1.5 \times 10^{-7}$ Pa, where the Al film 84 as the conductive thin film is formed on the wafer under the following conditions:

CVD method: Thermal CVD method
Source gas: $Al(i-C_4H_9)_3$
Carrier gas: Ar
Gas pressure: 0.02 Pa
Substrate temperature: 450° C.
Film thickness: 200 nm
Film forming speed: 50 nm/sec.

Subsequently, a buried layer actually formed under the above-described conditions was measured by the SEM. It was found that the hole 82 was completely filled with the buried layer or Al film 84. Moreover, the Al film was subjected to X-ray diffraction measurement, where the full width at half maximum of the rocking curve of the Al (111) peak was measured to estimate the orientation of the AlCu film. As a result, it was determined that the film has an extremely high orientation with a value of 0.41 degree as the full width at half maximum. In a case where the Al film was directly deposited on the $SiO_2$ film without the TaAl film, the Al film could not be buried in the trench.

As described above, in the invention, a conductive thin film with a high crystallinity is formed on an underlayer having depressions such as a trench, a hole, etc., with an amorphous thin film interposed there-between. The thus-formed conductive thin film serves as a wiring layer with a high electromigration resistance and a stress migration resistance.

Moreover, in the invention, the conductive thin film is grown in two stages in which the substrate temperature is set to different values. As a result, the conductive thin film can have a high orientation and a large grain. The thus-formed conductive thin film serves as a wiring layer with a high electromigration resistance and a stress migration resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An electric solid state device comprising:
a substrate;
an amorphous thin film formed on the substrate; and
a conductive thin film formed on the amorphous thin film;
wherein an interatomic distance calculated from a peak position of a halo pattern appearing in diffraction measurement of a material of the amorphous thin film is substantially equal to an interplanar space between those two adjacent specific crystal planes of a material of the conductive thin film, which are defined at least by respective atomic strings arranged in a predetermined direction in the respective planes and separated from each other by a largest interatomic distance possible.

2. The electric solid state device according to claim 1, wherein the formula $|df-ds|/ds \leq 0.25$ is satisfied, where ds represents the interatomic distance, and df represents the interplanar space.

3. The electric solid state device according to claim 1, wherein the substrate has a depression, the amorphous thin film is formed on an inner surface of the depression, and the conductive thin film is buried in the depression with the amorphous thin film interposed therebetween.

4. The electric solid state device according to claim 1, wherein the amorphous thin film contains at least one of elements contained in the conductive thin film, and at least one selected from a group consisting of IV-group, V-group and VI-group elements.

5. The electric solid state device according to claim 4, wherein the amorphous thin film further contains at least one selected from a group consisting of C, N, B, Si, P and Ge.

6. The electric solid state device according to claim 1, wherein the amorphous thin film contains at least one selected from a group consisting of IV-group, V-group and VI-group elements, and at least one selected from a group consisting of VIII-group, IX-group and X-group elements.

7. The electric solid state device according to claim 6, wherein the amorphous thin film further contains at least one selected from a group consisting of C, N, B, Si, P and Ge.

8. The electric solid state device according to claim 1, wherein the amorphous thin film contains at least one of elements contained in the conductive thin film, at least one XI-group element, and at least one selected from a group consisting of C, N, B, Si, P and Ge.

9. The electric solid state device according to claim 1, wherein the conductive thin film contains at least one selected from a group consisting of Al, Cu, Au, Pt, Ag, W and Si.

10. The electric solid state device according to claim 1, wherein the amorphous thin film contains TaAl, and the conductive thin film contains AlCu.

11. The electric solid state device according to claim 1, wherein the amorphous thin film contains NiZr, and the conductive thin film contains AlCu.

12. A method of manufacturing an electric solid state device comprising
forming an amorphous thin film on a substrate;
forming a conductive thin film on the amorphous thin film; and
forming the electric solid state device of claim 1; wherein the forming the conductive thin film includes performing film forming at a first temperature and subsequently performing film forming at a second temperature higher than the first temperature.

13. The method according to claim 12, wherein the first temperature is not more than 100° C., and the second temperature is not less than 150° C.

14. The method according to claim 12, wherein transfer from the forming the amorphous thin film to the forming the conductive thin film is performed in a non-oxidizing atmosphere.

15. The method according to claim 12, wherein transfer from the performing film forming at a first temperature to the subsequent performing film forming at a second temperature higher than the first temperature is performed in a non-oxidizing atmosphere.

16. The method according to claim 12, further comprising forming a depression in the substrate before forming the amorphous thin film, and flattening a surface of the conductive thin film to make the conductive thin film remain only in the depression.

17. The method according to claim 12, wherein the amorphous thin film contains at least one of elements contained in the conductive thin film, and at least one selected from a group consisting of IV-group, V-group and VI-group elements.

18. The method according to claim 12, wherein the amorphous thin film contains at least one selected from a group consisting of IV-group, V-group and VI-group elements, and at least one selected from a group consisting of VIII-group, IX-group and X-group elements.

19. The method according to claim 12, wherein the amorphous thin film contains at least one of elements contained in the conductive thin film, at least one XI-group element, and at least one selected from a group consisting of C, N, B, Si, P and Ge.

20. The method according to claim 12, wherein the conductive thin film contains at least one selected from a group consisting of Al, Cu, Au, Pt, Ag, W and Si.

21. An electric solid state device comprising
a substrate;
an amorphous thin film on the substrate; and
a conductive thin film on the amorphous thin film; wherein
the conductive thin film has a crystal structure and an enhanced orientation of specific crystal planes;
adjacent specific crystal planes of the conductive thin film are separated by an interplanar spacing;
an interatomic distance of the amorphous thin film, calculated from a maximum intensity peak of a halo pattern appearing in a diffraction measurement of the amorphous thin film, is substantially equal to the interplanar spacing; and
the crystal structure and the enhanced orientation of the conductive thin film are, respectively, one of
face centered cubic and (111), (200) or (220);
body centered cubic and (110) or (200); and
hexagonal and (002) or (110).

* * * * *